United States Patent [19]
Takashima et al.

[11] Patent Number: 5,864,508
[45] Date of Patent: Jan. 26, 1999

[54] DYNAMIC RANDOM-ACCESS MEMORY WITH HIGH-SPEED WORD-LINE DRIVER CIRCUIT

[75] Inventors: Daisaburo Takashima, Kawasaki; Yukihito Oowaki, Yokohama; Kenji Tsuchida, Kawasaki; Masako Ohta, Yokohama, all of Japan

[73] Assignee: Kabushiki Kaisha Toshiba, Kawasaki, Japan

[21] Appl. No.: 879,519

[22] Filed: Jun. 20, 1997

Related U.S. Application Data

[63] Continuation of Ser. No. 220,571, Mar. 31, 1994, abandoned, which is a continuation of Ser. No. 708,450, May 31, 1991, abandoned.

[30] Foreign Application Priority Data

Jun. 1, 1990 [JP] Japan ..................................... 2-141685

[51] Int. Cl.[6] ..................................................... G11C 7/04
[52] U.S. Cl. ...................................... 365/189.11; 365/203
[58] Field of Search ............................. 365/174, 189.11, 365/203, 230.06

[56] References Cited

U.S. PATENT DOCUMENTS

| | | | |
|---|---|---|---|
| 4,769,792 | 9/1988 | Nogami et al. | 365/203 |
| 4,788,664 | 11/1988 | Tobita | 365/189 |
| 4,807,190 | 2/1989 | Ishii et al. | 365/203 |
| 4,814,647 | 3/1989 | Tran | 365/203 |
| 4,896,297 | 1/1990 | Miyatake et al. | 365/203 |
| 4,947,760 | 8/1990 | Komatsu et al. | 365/203 |
| 5,119,334 | 6/1992 | Fujii | 365/189.11 |

OTHER PUBLICATIONS

IEEE Journal of Solid-State Circuits, vol. 23, No. 5, Oct. 1988, pp. 1128–1132, M. Horiguchi, et al., "Dual-Operating-Voltage Scheme For A Single 5–V 16–MBIT Dram".

Kitsukawa, et al. "A 1–Mbit BiCMOS Dram Using Temperature–Compensation Circuit Techniques", Jun. 1989, pp. 597–602.

Nakagome, et al. "A 1.5V Circuit Technology for 64Mb Drams", 1990, pp. 17, 18.

*Primary Examiner*—Terry D. Cunningham
*Attorney, Agent, or Firm*—Oblon, Spivak, McClelland, Maier & Neustadt, P.C.

[57] ABSTRACT

A random-access memory includes an array of rows and columns of memory cells. Word lines are associated with rows of memory cells, bit lines lines are with columns of memory cells. A row decoder and a core control circuit are connected to the word lines. A column decoder and a sense amplifier circuit are connected to the bit lines. An individual cell may be addressed by addressing an individual column through a column decoder controlling the voltage on each word line, and through a row decoder controlling the voltage on each word line in response to specified row and column addresses input via row and column address buffers. A booster circuit provides the row decoder with a boosted voltage as a word-line drive voltage. This voltage has been transmitted to a pre-decoder section in the core control circuit before the row address is acquired in the row decoder.

23 Claims, 15 Drawing Sheets

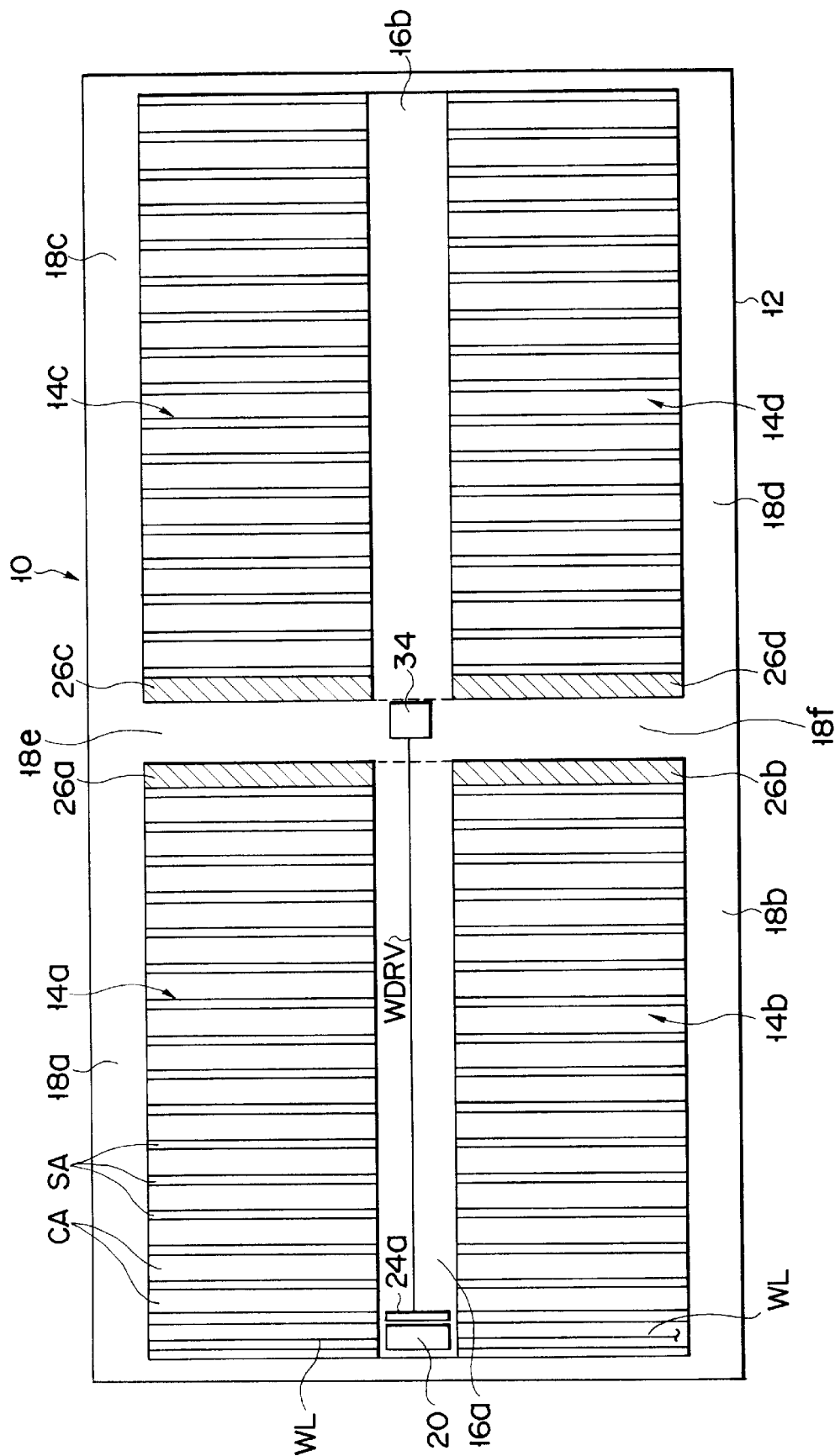
F I G. 1

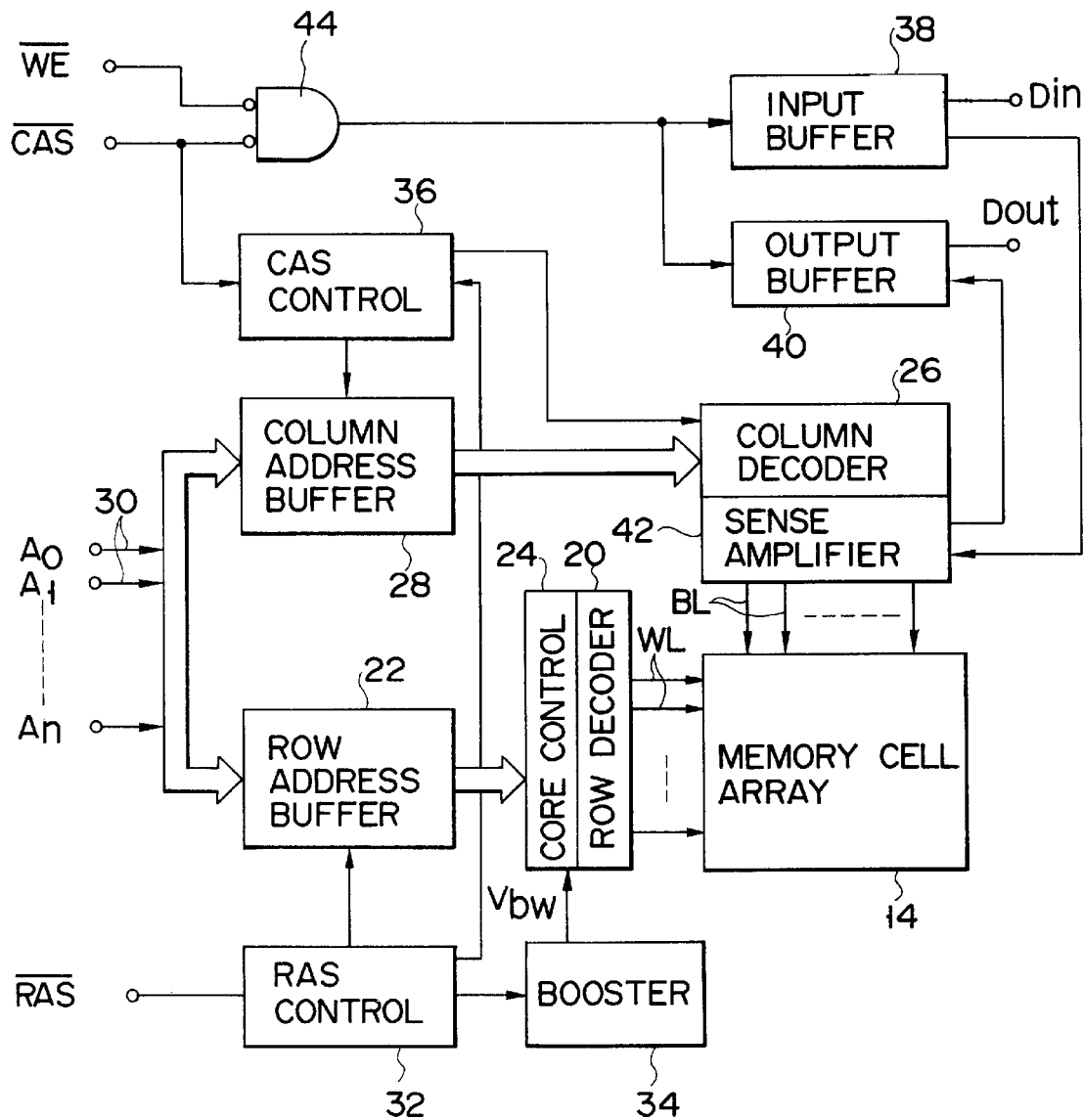
F I G. 2

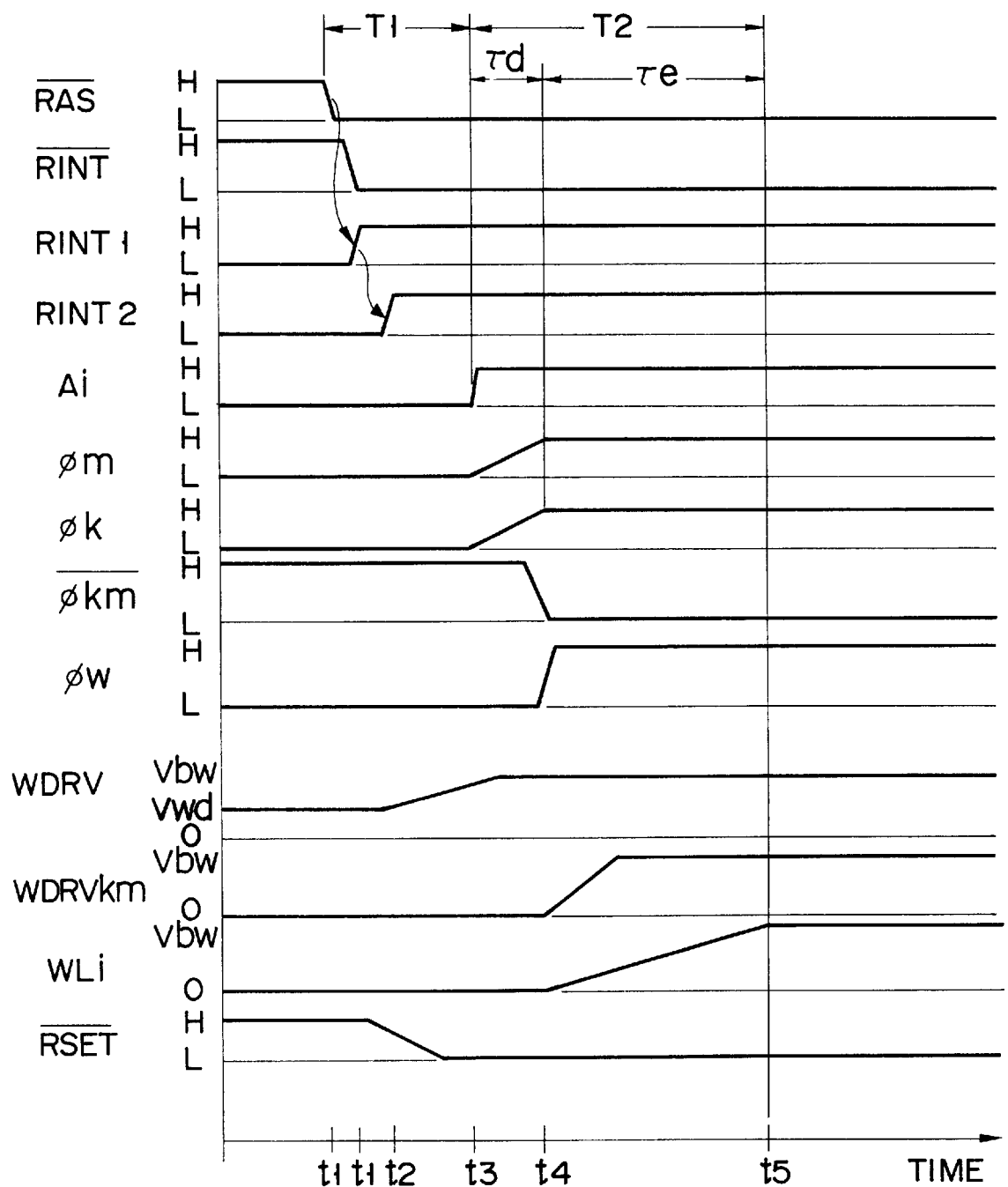
F I G. 4

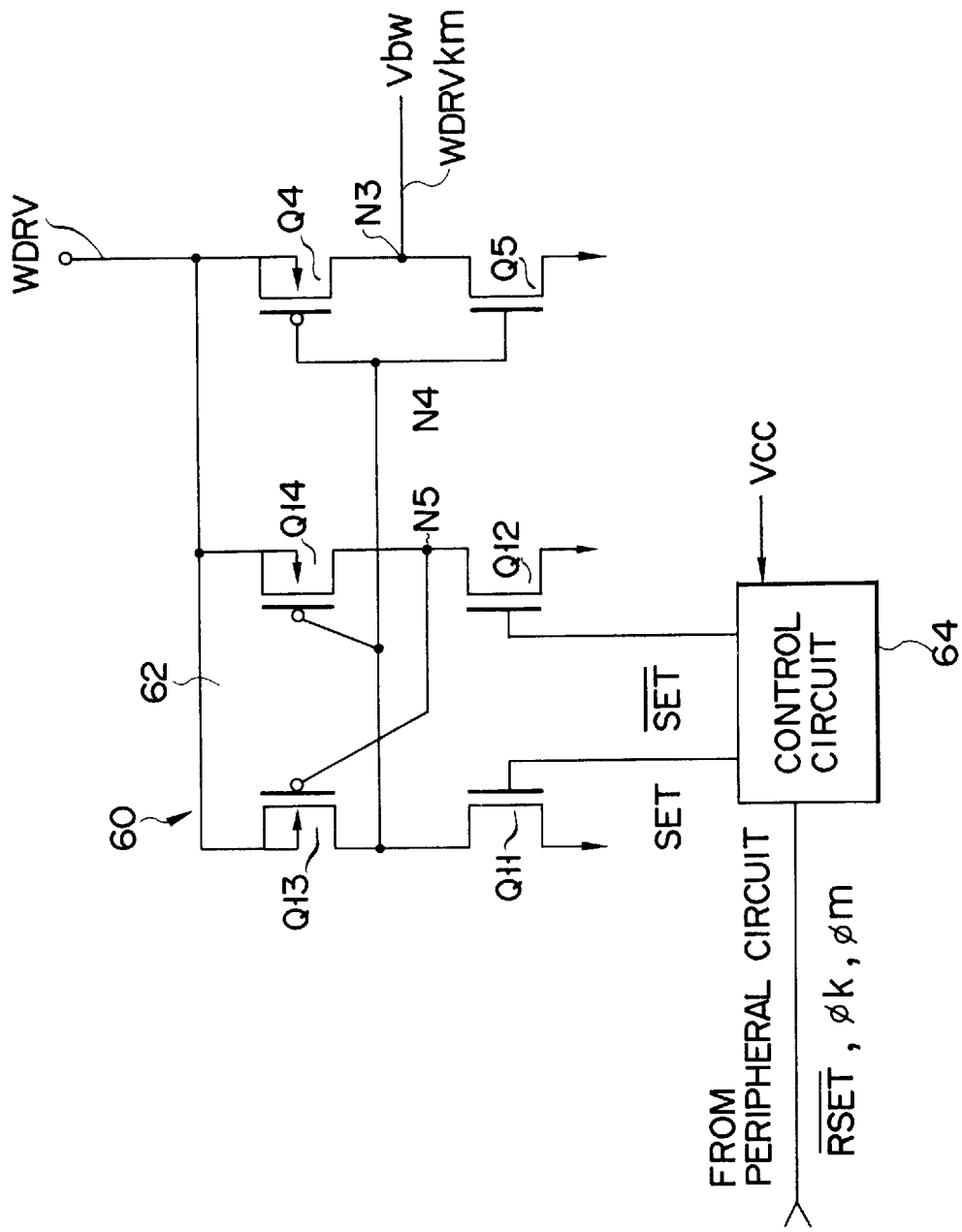
F I G. 6

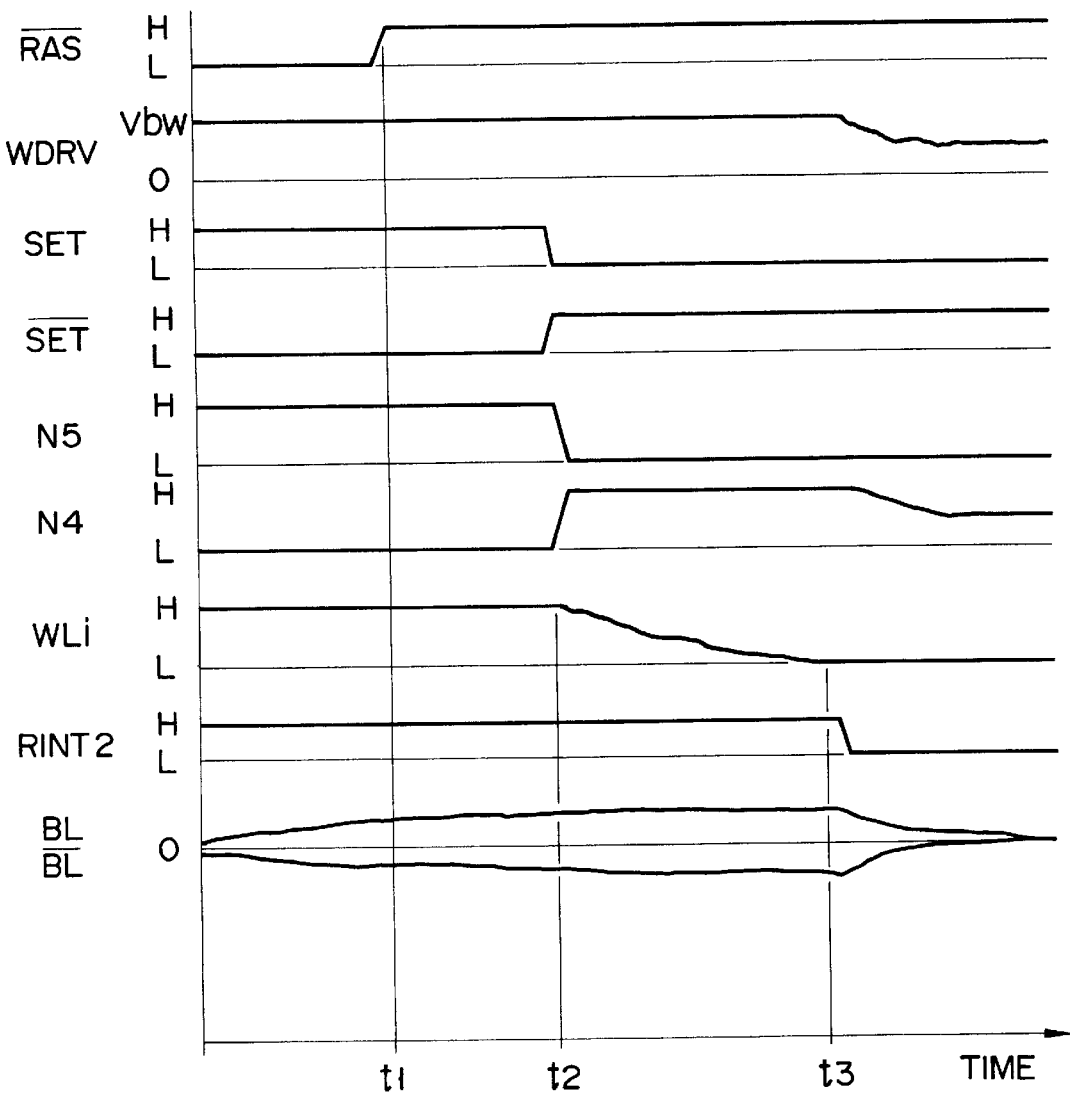
F I G. 7

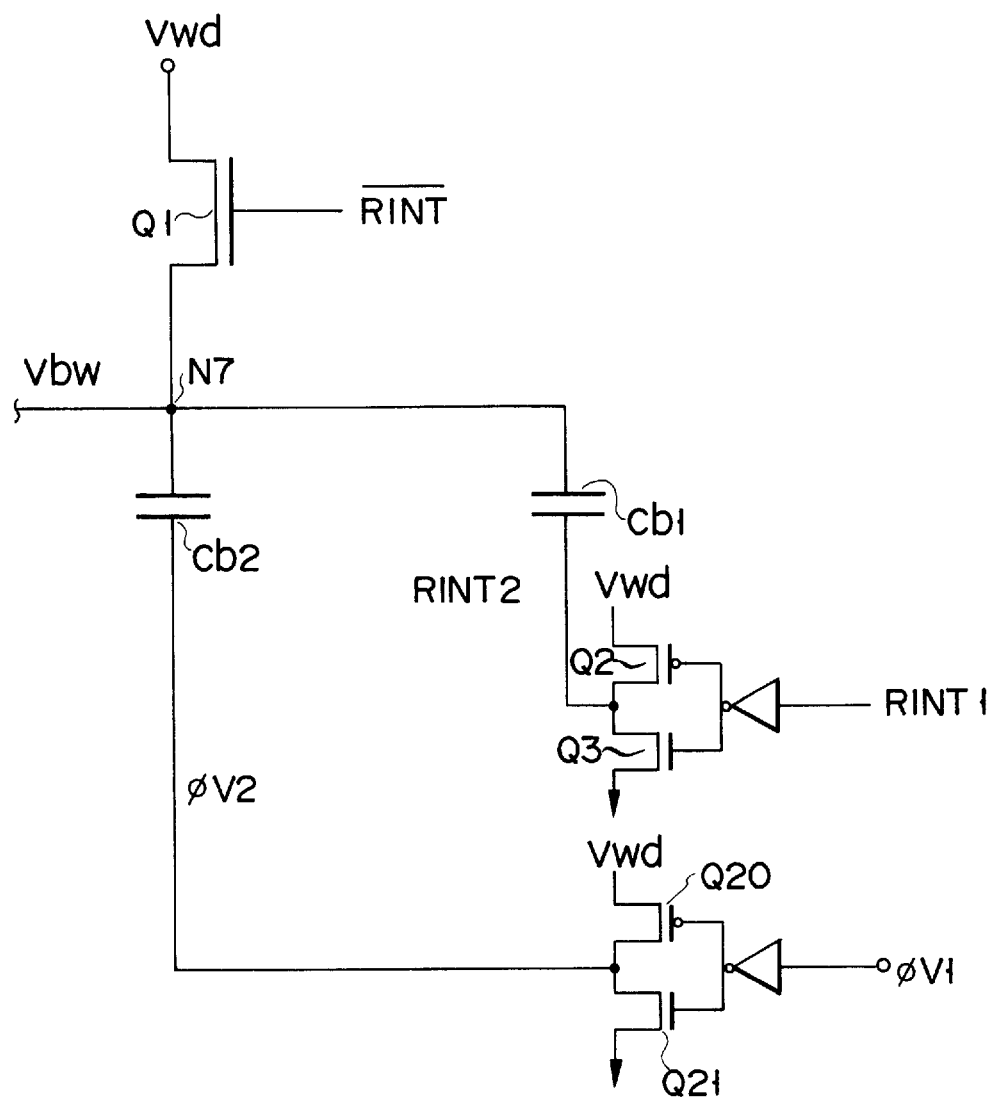
F I G. 9

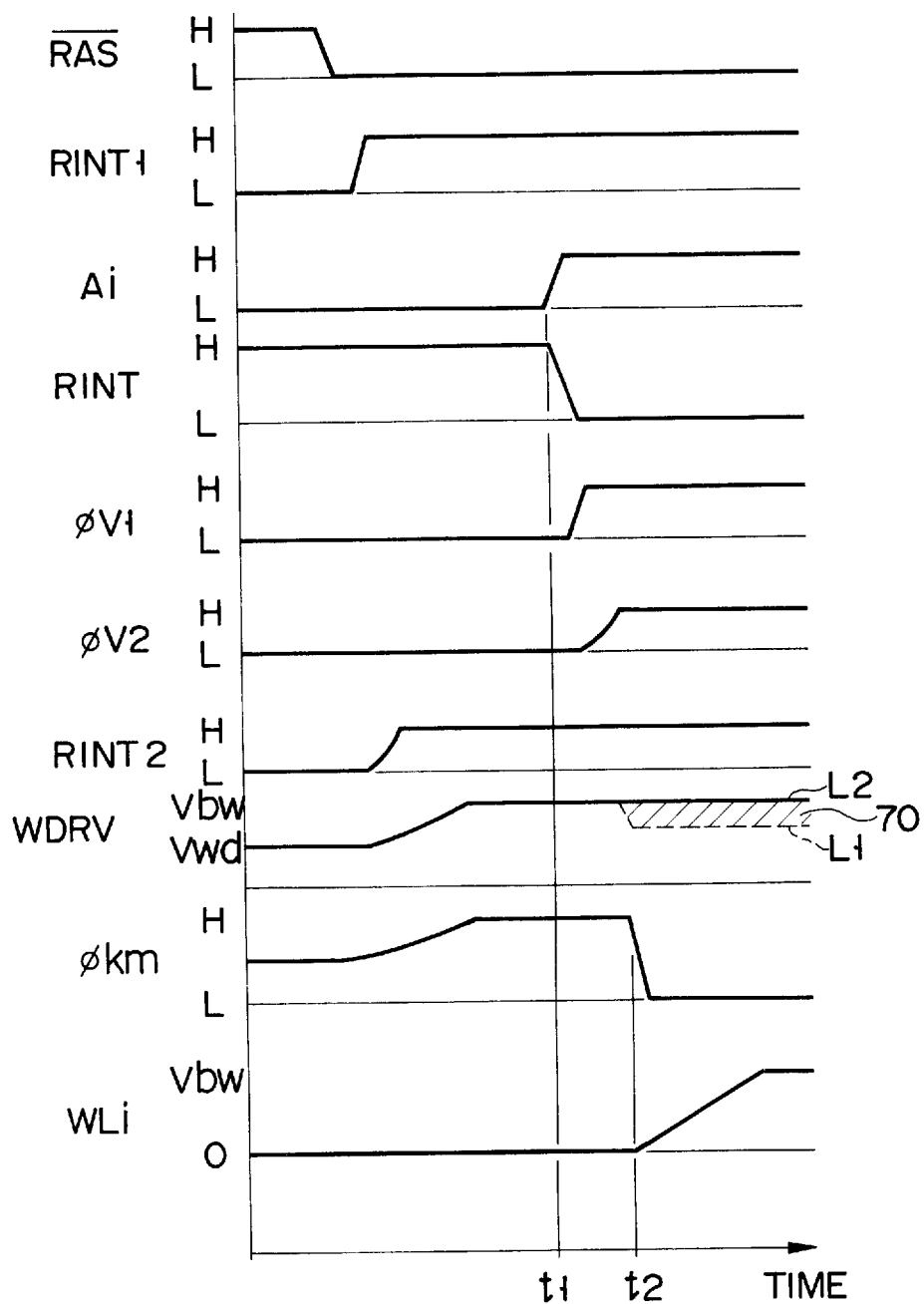
F I G. 10

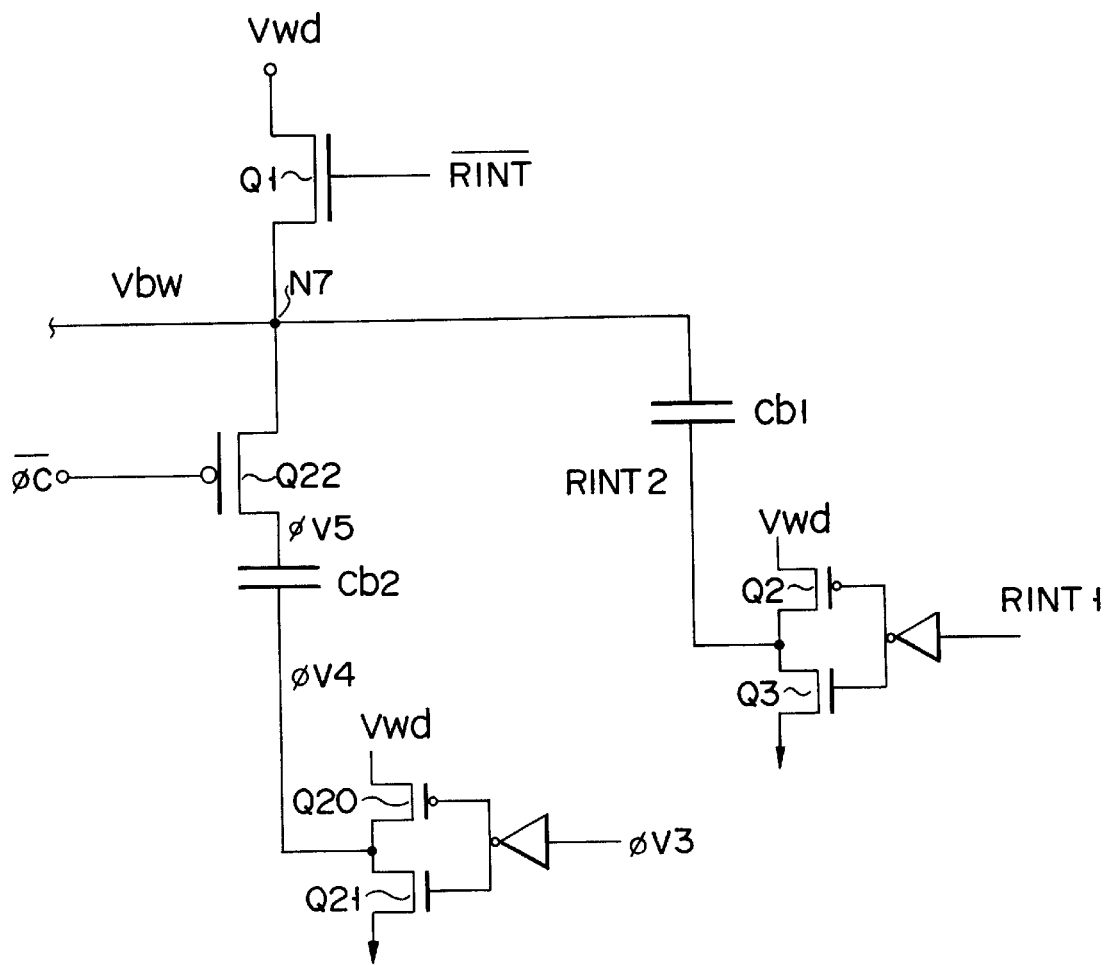
F I G. 11

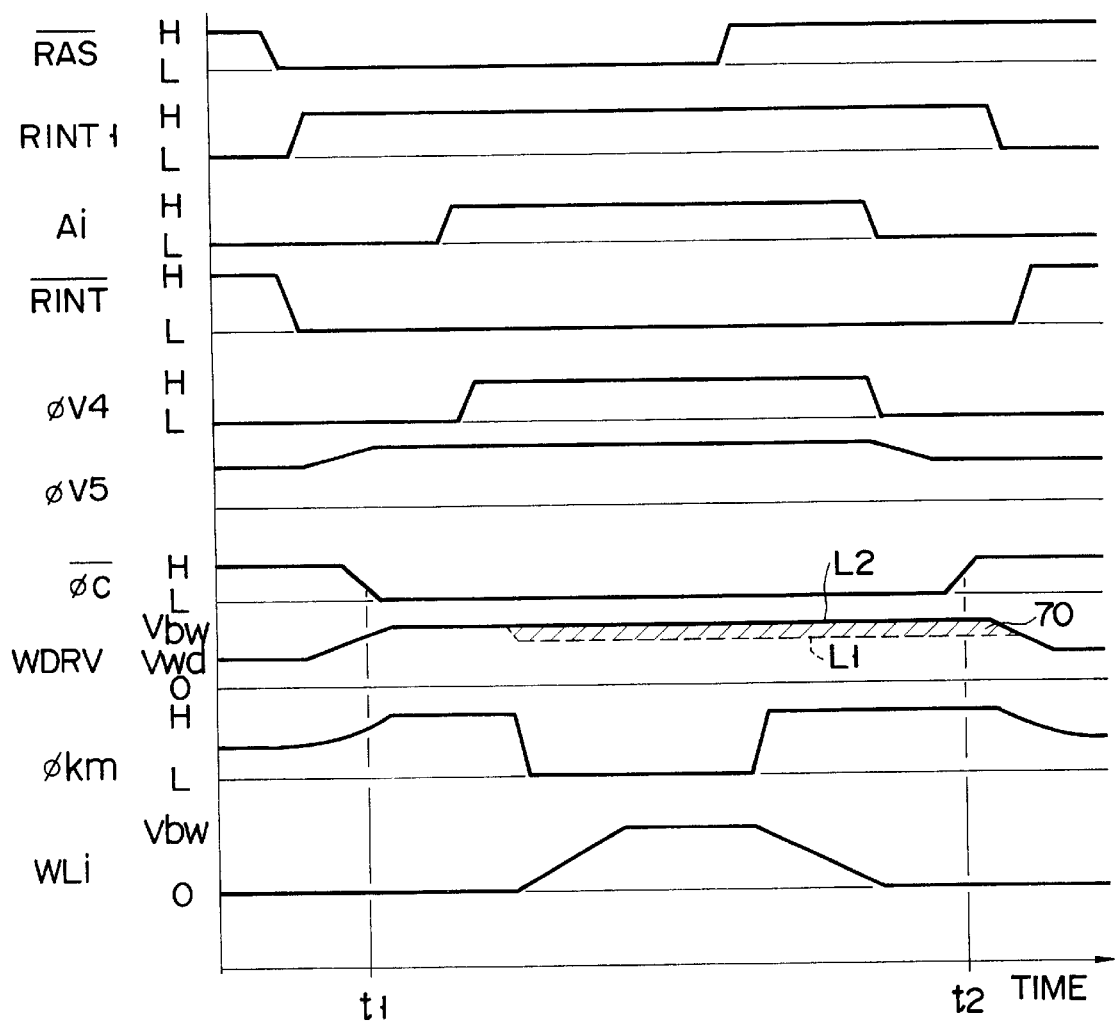
F I G. 12

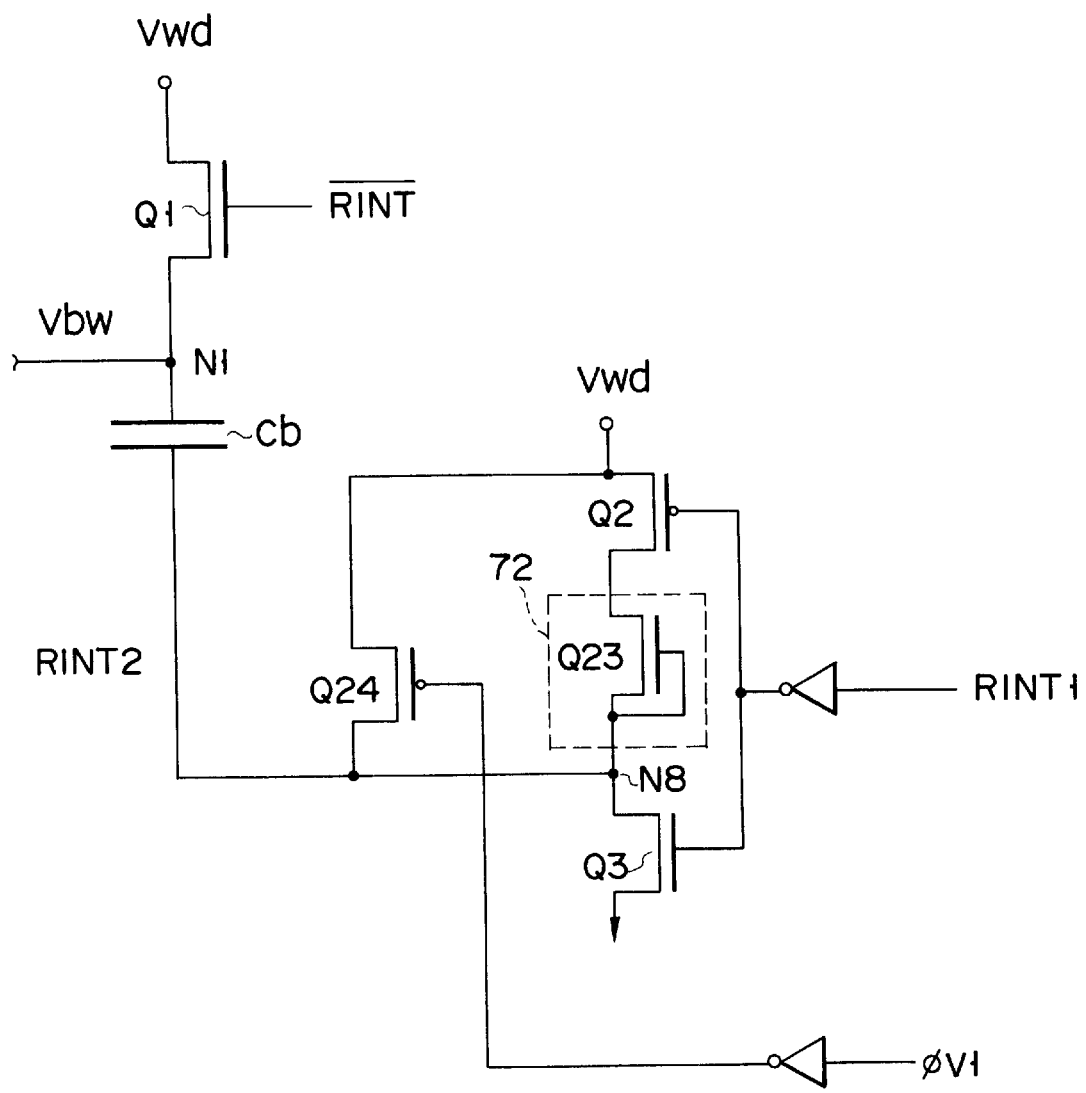
F I G. 13

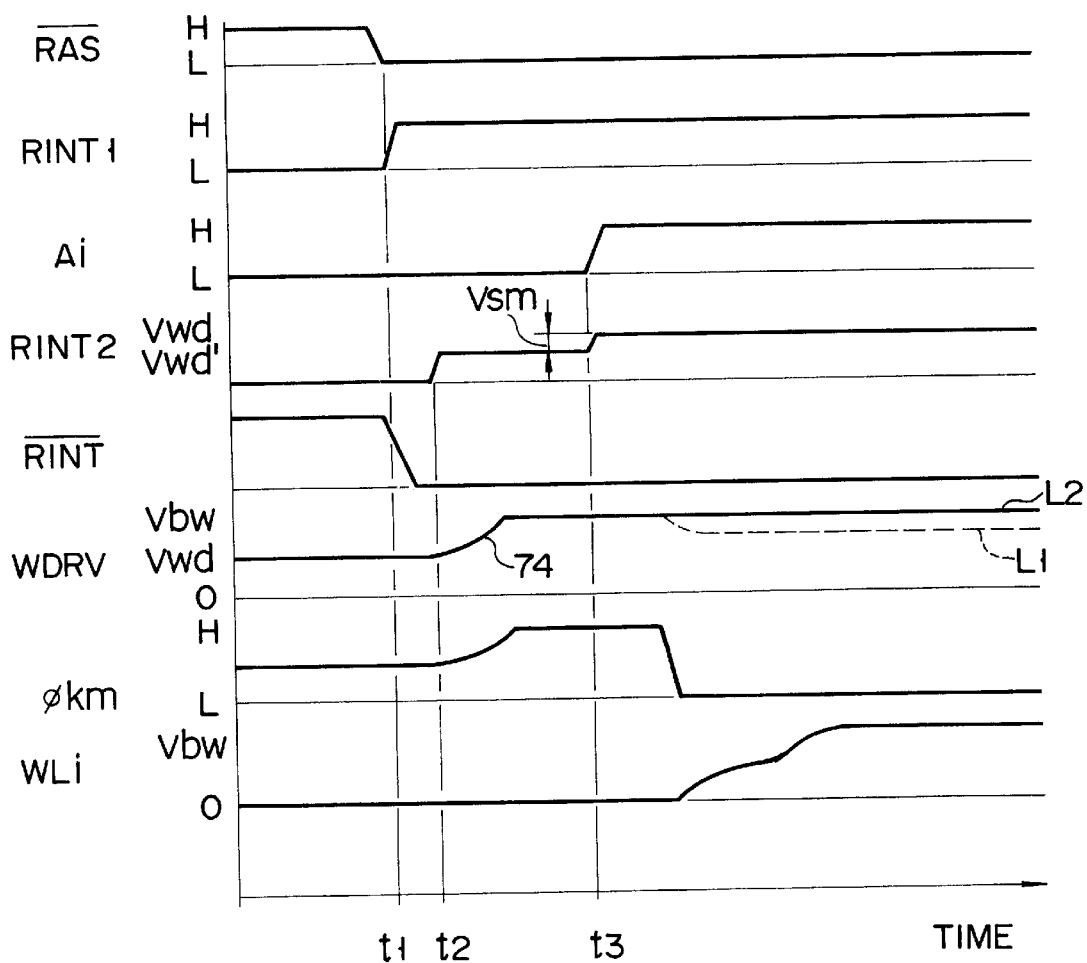
F I G. 14

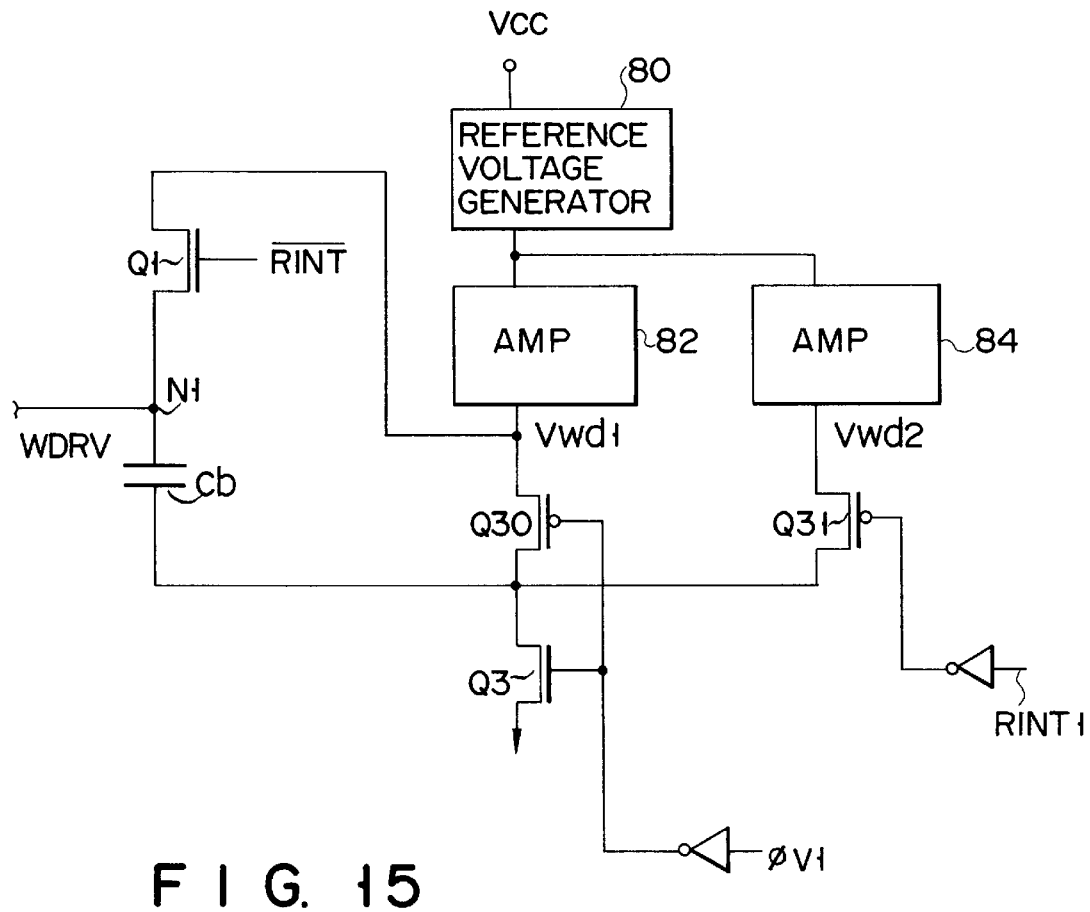
F I G. 15
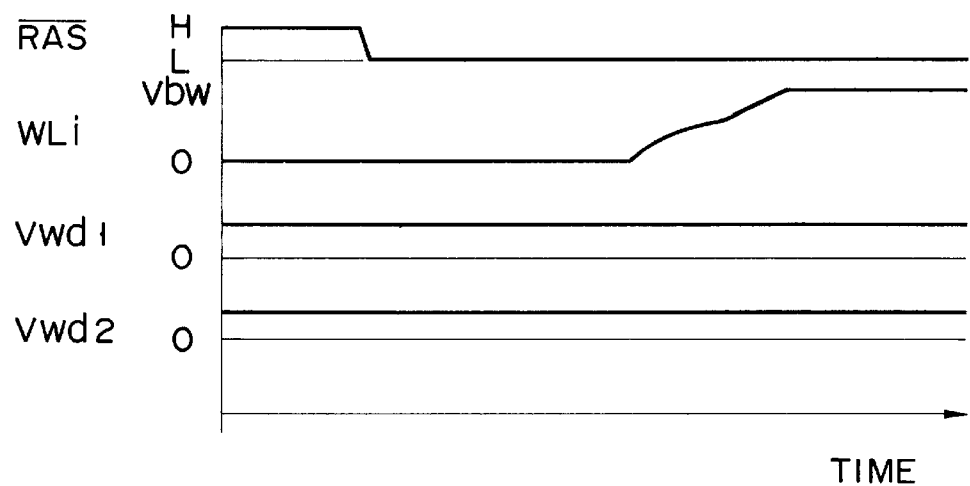
F I G. 16

DYNAMIC RANDOM-ACCESS MEMORY WITH HIGH-SPEED WORD-LINE DRIVER CIRCUIT

This application is a Continuation of application Ser. No. 08/220,571, filed Mar. 31, 1994, now abandoned, which is a continuation of application Ser. No. 07/708,450, filed May 31, 1991, now abandoned.

BACKGROUND OF THE INVENTION

1. Field of the Invention

The present invention relates generally to highly-integrated semiconductor memory devices, and more particularly to a dynamic random-access memory incorporating therein a peripheral circuit arrangement that generates a potentially raised or boosted voltage for use in word-line drive operations.

2. Description of the Related Art

Semiconductor dynamic random-access memory (DRAM) devices using MOS transistors are becoming more widely used in the manufacture of digital computer systems, as the speed and cost advantages of these devices increase. The cost per bit of storage using RAMs has decreased as the number of bits or memory cells per package increases. As the number of bits increases, the memory cell size decreases while a chip substrate size is gradually expanded, thereby to attain a higher packing density thereon. This causes signal transmission on word lines associated with the memory cells to undesirably decrease due to an increase in the resistance of the word lines and inherent parasitic capacitance thereof on enlarged chip substrate. This factor degrades the performance of the MOS-DRAMS: the speed of data-access operations.

There is a trade-off between the packing density and the data-access speed in such DRAMs. As DRAMs require higher packing density and higher speed, the booster circuit for providing the word lines with a drive signal of potential-raised potential becomes more critical. Conventionally, the booster circuit serves to supply the drive signal to a selected one of the word lines so as to enable a high voltage, representing a "1" bit of binary information, to be stored or "written" into a storage capacitor of a memory cell being selected. The word-line drive signal of boosted potential is generated once after a data-write address is designated externally; the word lines are typically deactivated and kept at the low potential level before the address is designated. It is only after the address establishment is done that the boosted drive voltage is allowed to be transferred to the selected word line via a pre-decoder circuit and a wiring line of increased length. This results in the potential rise up to a required high potential level being delayed on the selected word line; in other words, the activated word line is "ramped" slowly toward the high potential level. It thus takes much time for the charge-up operation at the storage capacitor in a selected memory cell. The high-speed data access operations of DRAMs cannot be expected.

SUMMARY OF THE INVENTION

It is therefore an object of the present invention to provide an improved dynamic random-access memory device.

It is another object of the present invention to provide an improved MOS random-access memory device of high packing density incorporating high-speed word-line drive technique.

In accordance with the above objects, the present invention is addressed to a specific integrated memory device which has an array of memory cells arranged in rows and columns. Row lines are associated with rows of memory cells, whereas column lines are associated with columns of memory cells. A row decoder section is connected to the row lines, for selecting a certain row line from among the row lines. Column decoder section is connected to the column lines, for designating one of the column lines. A driver section is provided connected to the row decoder section, for generating a boosted voltage to be employed as a row-line drive voltage, and for permitting the specific voltage to be transmitted to the row decoder means before an address specifying a desired memory cell is established in the row decoder means, whereby a ramping time of the certain row line toward the specific voltage is shortened to speed up a row line drive operation.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a diagram showing a plan view of a dynamic random-access memory (DRAM) chip that embodies the present invention.

FIG. 2 is a schematic block diagram of the internal circuit arrangement of the DRAM.

FIG. 4 is an illustration of a timing diagram showing the pulse sequence for the operation of the embodiment of FIGS. 1 to 3.

FIG. 6 is a schematic block diagram of the main internal circuit arrangement of the DRAM in accordance with a second embodiment of the invention.

FIG. 7 is an illustration of a timing diagram showing the pulse sequence for the operation of the embodiment of FIG. 6.

FIGS. 9, 11, 13 and 15 are further embodiments of booster circuit each serving as the word-line driver circuit, and FIGS. 10, 12, 14 and 16 are illustrations of timing diagrams showing the pulsing sequences of each of the embodiments of the preceding figures.

DETAILED DESCRIPTION OF THE PREFERRED EMBODIMENTS

Figure 3:
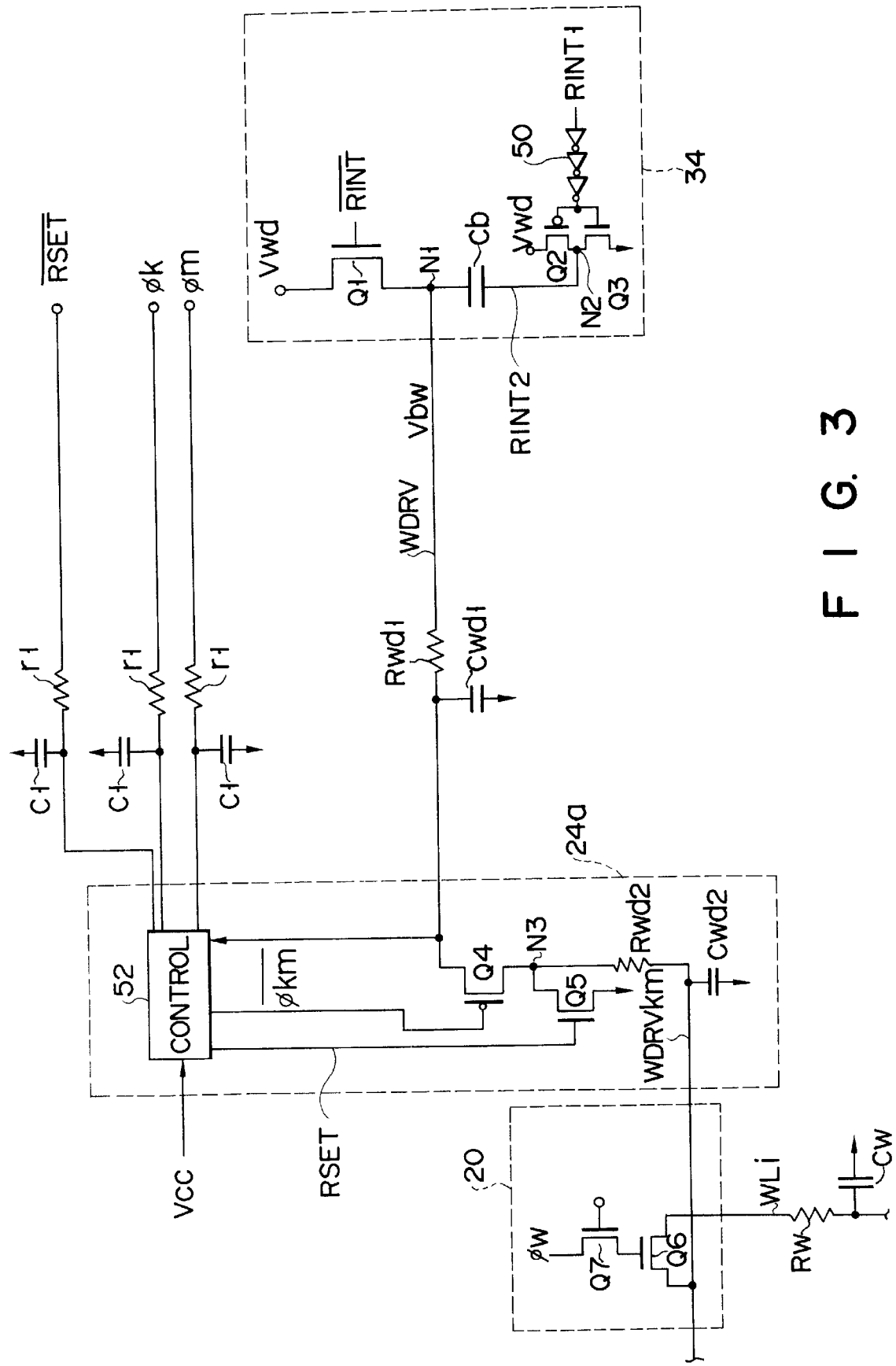
FIG. 3 is a diagram showing the circuit configuration of the main sections of the DRAM, including a word-line drive circuit, a row decoder, and a pre-decoder section of a core control circuit.

Referring to FIG. 1, a MOS dynamic random-access memory (DRAM) device in accordance with one preferred embodiment of the invention is designated generally by reference numeral "10." DRAM 10 has a silicon chip substrate 12 of rectangular planar shape. Four memory cell blocks 14*a*, 14*b*, 14*c* and 14*d* are arranged on substrate 12; each block includes a preselected number of memory cells. The first and second memory cell blocks 14*a* and 14*b* define therebetween an elongated central surface area 16*a* peripheral to the four blocks 14*a*–14*d* in which core control circuits are arranged. Another surface area 16*b* peripheral to the four blocks 14*a*–14*d* defined between the third and fourth blocks 14c and 14d is reserved for core control circuits. Marginal surface areas 18a, 18b, 18c, 18d, 18e, 18f in addition to surface areas 16a and 16b around four blocks 14a–14d define a peripheral region of chip substrate 12. In this region a peripheral circuit arrangement associated with blocks 14 is arranged, including row and column decoder circuits, data input/output circuits, and so forth.

Each of memory cell blocks 14 includes an array of rows and columns of rewritable memory cells. These memory cells are associated with parallel data transfer lines and parallel control lines, which insulatively cross each other to define cross points therebetween. An individual memory cell is provided at each cross point of these crossed lines. The data transfer lines may be called "data lines," or "bit lines"; the control lines may be "digit lines," or "word lines."

Each memory cell has the so-called "one-capacitor/one-transistor" structure; it includes a capacitor serving as data storage element, and an insulated-gate transistor serving as a "transfer gate" between a corresponding bit line BLi and the storage capacitor. The cell transistor may be a metal-oxide-semiconductor field effect transistor (MOSFET). The cell transistor has one current-carrying electrode (typically, drain electrode) connected to a corresponding one of the bit lines BL. The cell transistors included in one row of memory cells have control gate electrodes connected in common to a corresponding word line WLi.

The main circuit arrangement of DRAM 10 is illustrated in FIG. 2, wherein a row decoder 20 is connected to the word lines, and selects one of the row lines (word lines) as determined by a row (or X) address contained in a row address latch or buffer 22. A core control circuit 24 is provided adjacent to row decoder 20. Core control circuit 24 includes a known pre-decoder circuit, a control subcircuit for spare word lines, a bit-line equalizer circuit, a sense amplifier drive circuit, and so forth. A column decoder 26 selects one of the column lines (bit lines) as determined by a column (or Y) address contained in a column address buffer 28. These addresses include address bits A0, A1, . . . , An, and are applied to the buffers 22 and 28 by a predetermined bit number of address lines 30 on a time-share basis.

A control circuit 32 is arranged to drive row address buffer 22 in response to a row address strobe signal $\overline{RAS}$ input thereto; this circuit will be referred to as "RAS controller." The output of RAS controller 32 is applied to core controller 24 via a voltage booster circuit 34 serving as a word-line driver circuit. The circuit 34 generates a potential-increased or boosted voltage Vbw for a word-line drive signal. Another control circuit 36 is provided as a "column address buffer controller" or "CAS controller," which controls the buffering operation of column address buffer 28 in response to a column address strobe input $\overline{CAS}$. An input data buffer (or latch) 38 and an output data buffer 40 are connected to a known sense amplifier circuit 42, which is associated with bit lines. A logic AND gate 44 is connected at its output to buffers 38 and 40. A write-enable ($\overline{WE}$) signal is supplied to a first input of AND gate 44; the $\overline{CAS}$ is supplied to a second input of gate 44 and CAS controller 36.

As shown in FIG. 1, each memory cell block 14a, 14b, 14c, 14d includes subarrays CA aligned in a constant interval, and sense amplifier sections SA that are alternately located thereamong. A row decoder circuit 20 and a core control circuit 24 are associated with each subarray SA. The voltage-booster circuit 34 acting as a word-line driver is located centrally on substrate 12; it is in the middle of peripheral circuit areas 18e and 18f in which the corners of blocks 14 face one another. Booster circuit 34 may be shared in common by these memory cell blocks 14. A component 24a represents a pre-decoder included in the core control circuit 24. Circuit 24 is connected to word-line driver circuit 34 by a wire line WDRV extending within core control circuit 24. This line will be referred to as "word-line booting-drive line" hereinafter. A pre-decoder circuit conventionally employed for word-line driver circuit 34 is not provided within peripheral area 16a. The same goes with the other peripheral area 16b.

It is more clearly shown in FIG. 3 that the word-line driver circuit 34 is connected by word-line drive line WDRV to row decoder 20 via pre-decoder circuit 24a included in core controller 24. Circuit 34 includes three MOS transistors Q1, Q2, Q3, and a capacitor Cb. Capacitor Cb acts as "booting" or bootstrap capacitor and produces a high voltage of increased potential. Transistor Q1 has a gate electrode connected to a control signal input $\overline{RINT}$, a source electrode connected to a constant power-supply voltage input Vwd, and a drain electrode connected to a circuit node N1. Voltage Vwd is a specific d.c. voltage that is produced using a power supply voltage Vcc of DRAM 10 so as to be kept constant regardless of unwanted potential variation in the power supply voltage Vcc. Transistor Q1 may be an N-channel MOSFET. Node N1 is connected to a first electrode plate (precharge terminal) of capacitor Cb. Transistor Q1 acts as a charge-up driver for performing a precharge function at node N1.

Transistor Q2 is a P-channel MOSFET; transistor Q3 is an N-channel MOSFET. These transistors are connected in series with each other constituting a capacitor-driver circuit. The source electrode of transistor Q2 is supplied with the power supply voltage Vwd. The gate electrode of transistor Q3 is connected to a control signal input RINT1 through a series circuit of three inverters 50. A common node N2 of transistors Q2 and Q3 is connected to a second electrode (control terminal) of capacitor Cb. Responding to signal RINT1 one of transistors Q2 and Q3 turns on. A control signal RINT2 appears at node N2. Control signals $\overline{RINT}$ and Rint1 are specific signals that are supplied to circuit 34 before a certain address is designated and established.

Very importantly, any pre-decoder circuit that has been conventionally arranged at the output (node N1) of word-line driver circuit 34 is not employed. The output of circuit 34 is connected directly to word-line drive line WDRV. A resistor Rwd1 represents the resistance of line WDRV; a capacitor Cwd1 represents a parasitic capacitance that is inherent in line WDRV.

The circuit 24a includes a control circuit 52 that receives an external control signal $\overline{RSET}$ and row address signals φk and φm to generate control signals RSET and $\overline{\phi km}$. Control signals RSET and $\overline{\phi km}$ may potentially change between a substrate voltage Vss of the chip substrate 12 and the boosted voltage Vbw; controller 52 operates by using word-line drive voltage Vbw as its own power supply voltage.

A MOS transistor Q4, which may be a P-channel MOSFET, has a gate electrode to which control signal $\overline{\phi km}$ is supplied. Transistor Q4 is connected at one current carrying electrode to line WDRV; the transistor is also connected at the other current carrying electrode to a MOS transistor Q5 as shown in FIG. 3. Transistor Q5 has its gate electrode connected to control signal RSET output of controller 52. A common node N3 of transistors Q4 and Q5 is connected to row decoder 20 by an output signal transmission line WDRVkm which acts as a second word-line drive line. A resistor Rwd2 represents the resistance of line WDRVkm; a capacitor Cwd2 represents an inherent parasitic capacitance therein. Transistor Q4 may function as a switch device for causing the first and second word-line drive lines WDRV and WDRVkm to be selectively connected with each other. Transistor Q5 may act as a discharge-control device for the word-line drive line. Since the row decoder 20 and pre-decoder 24a are positionally close to each other on the substrate 12 as shown in FIG. 1, second word-line drive line WDRVkm is shorter than first word-line drive line WDRV for connecting the pre decoder 24a to the voltage booster 34 which is distant therefrom on substrate 12 as shown in FIG. 1.

As shown in FIG. 3, the row decoder 20 includes N-channel MOS transistors Q6 and Q7. Transistor Q6 is switch-driven by a row address signal $\phi w$ that is supplied to the gate electrode thereof through transistor Q7. Transistor Q6 is associated at one current carrying electrode thereof with a word line Wli which is connected to a corresponding array of memory cells. A capacitor Cw represents a parasitic capacitance which is inherent in the word line WLi; it will be referred to as the "word line capacitance." A resistor Rw represents a resistance of word line WLi.

The word-line drive operation in DRAM 10 is as follows. While a row address strobe signal $\overline{RAS}$ is at the high potential level ("H" level), the node N1 of word-line drive circuit 34 has been precharged by transistor Q1 up to the voltage Vwd as shown in FIG. 4. The signal $\overline{RAS}$ falls at the low potential level ("L" level) at a time t1. Then the control signal $\overline{RINT}$ potentially changes from "H" level to "L" level at a time t2. Responding to this, control signal RINT1 rises from "L" level to "H" level. Word-line drive line WDRV is now ramped slowly toward voltage Vbw at a time t3.

A fixed length of time period T1 would have been inherently required after $\overline{RAS}$ changed at the "H" level and before a row address is determined or established. The embodiment is specifically arranged such that, during such period T1, the boosted output voltage Vbw of circuit 34 is permitted to be transmitted and applied by line WDRV to the input of pre-decoder 24a. The delay time Tdel in the voltage transmission is given by $$Tdel = \tau a + \tau b + \tau c, \quad (1)$$

where $\tau a$ is the actual delay time taken after fetching of $\overline{RAS}$ and before potential rise in signal RINT1, $\tau b$ is a delay time required to cause the control terminal of bootstrap capacitor Cb to begin to potentially rise, $\tau c$ is a delay time necessary for the boosted voltage at node N1 to reach the core control circuit 24 through line WDRV. Delay time $\tau c$ is equal to Rwd1·Cwd1. Of these delay times, $\tau c$ is the most significant one. This delay time, however, will not a serious cause of delay in the word-line boost-drive operation, since time period $\tau c$ is in the inherent delay time period T1 of address accomplishment. The delay in voltage-rise driving of a designated word line WLi primarily depends on the delays in address signals $\phi k$ and $\phi m$ supplied to pre-decoder 24a. The delay time $\tau d$ may defined as:

$$\tau d = c1 \cdot r1, \quad (2)$$

where r1 is the resistance of each of the transmission line of signals $\phi k$ and $\phi m$ as shown in FIG. 3, c1 is parasitic capacitance inherent in each of the transmission lines for signals $\phi k$ and $\phi m$. After address is determined, signals $\phi k$ and $\phi m$ begin to potentially rise from "L" level at time t3, and reach "H" level at a time t4. Delay time $\tau d$ is equal to the length of a period t3–t4.

Responding to the potential change of the address signals $\phi k$ and $\phi m$, the potential of signal $\overline{\phi km}$ changes from "H" level to "L" level. Transistor Q4 in pre-decoder 24a thus turns on. At the same time, control signal RSET becomes at "L" level turning off the discharging transistor Q5. The turn-off of transistor Q4 allows the boosted voltage Vbw on the first word-line drive line WDRV to be introduced onto the second word-line drive line WDRVkm. Voltage Vbw is thus supplied to the target word line WLi via row decoder 20. Word line is ramped gradually toward voltage Vbw; it reaches voltage Vbw at a time t5. The length of period t4–t5, i.e., word-line drive delay $\tau e$, is substantially equal to:

$$\tau e = (Cw + Cwd2) \cdot (Rw + Rwd2). \quad (3)$$

As a consequence, a total delay time T2 that is taken for the target word line to reach the boosted voltage of a predetermined potential after the address has been defined is shortened as may be represented as follows:

$$T2 = \tau d + \tau e. \quad (4)$$

In the DRAM 10, after the write mode is ended, the activation of the selected word line (WLi) is canceled, causing it to be deactivated to the initial potential state. To do this, the control signal $\overline{\phi km}$ is set at the "H" level turning transistor Q4 off. The control signal RSET rises toward the "H" level turning transistor Q5 on. With such a potential control while drive line WDRV is at the "H" level, only the word line WLi and drive line WDRVkm drop to the potential Vss. This can decrease delay in the deactivation-drive operation for word line WLi.

With the aforesaid embodiment, the boosted word-line drive voltage Vbw is specifically permitted to travel on line WDRV and arrive at the input of pre-decoder 24a during the inherent delay time period T1 ranging from the potential drop time t1 of $\overline{RAS}$ to the address-accomplishment time t3. In other words, the first word-line drive line WDRV has already risen up to boosted voltage Vbw before the corresponding address is acquired in row decoder 20. This means that the transmission delay time Tdel of voltage Vbw from circuit 34 to pre-decoder 24a may be "absorbed" by inherent delay time T1. Therefore, delay time T2 necessary for word line WLi to reach voltage Vbw can become free from the delay time Tdel given by equation 1, and shortened by the time length corresponding to period Tdel. This can speed up the word-line driving operation, and thus the data accessing operation in DRAM 10.

It is also important in the above embodiment that the row decoders 20 are positionally distributed on the chip substrate 12 so as to be associated with subarrays Ca of memory cells, respectively, and that each pre-decoder 24a is located in adjacent to the input stage of a corresponding row decoder as seen from the illustration of FIG. 1. Such layout can ease the circuit-patterning design of these row decoders that suffers conventionally from strict requirements. In addition, since pre-decoder 24a is provided only in core control circuit section 24, DRAM 10 may be released from the conventional problem of an increase in chip size. This can be said for the reasons below. If the boosted drive voltage has been applied to row decoder 20 before an address is established, it is required that a similar circuit arrangement is arranged in row decoder 20 for every one of the word lines WL. This leads to an undesirable increase in the chip area. Unlike this, with the aforementioned embodiment, the boosted voltage has been transmitted up to pre-decoder 24a. The pre-decoder is less than row decoder 24 in the number of circuit elements required; this fact can minimize an increase in the chip layout area.

Figure 5:
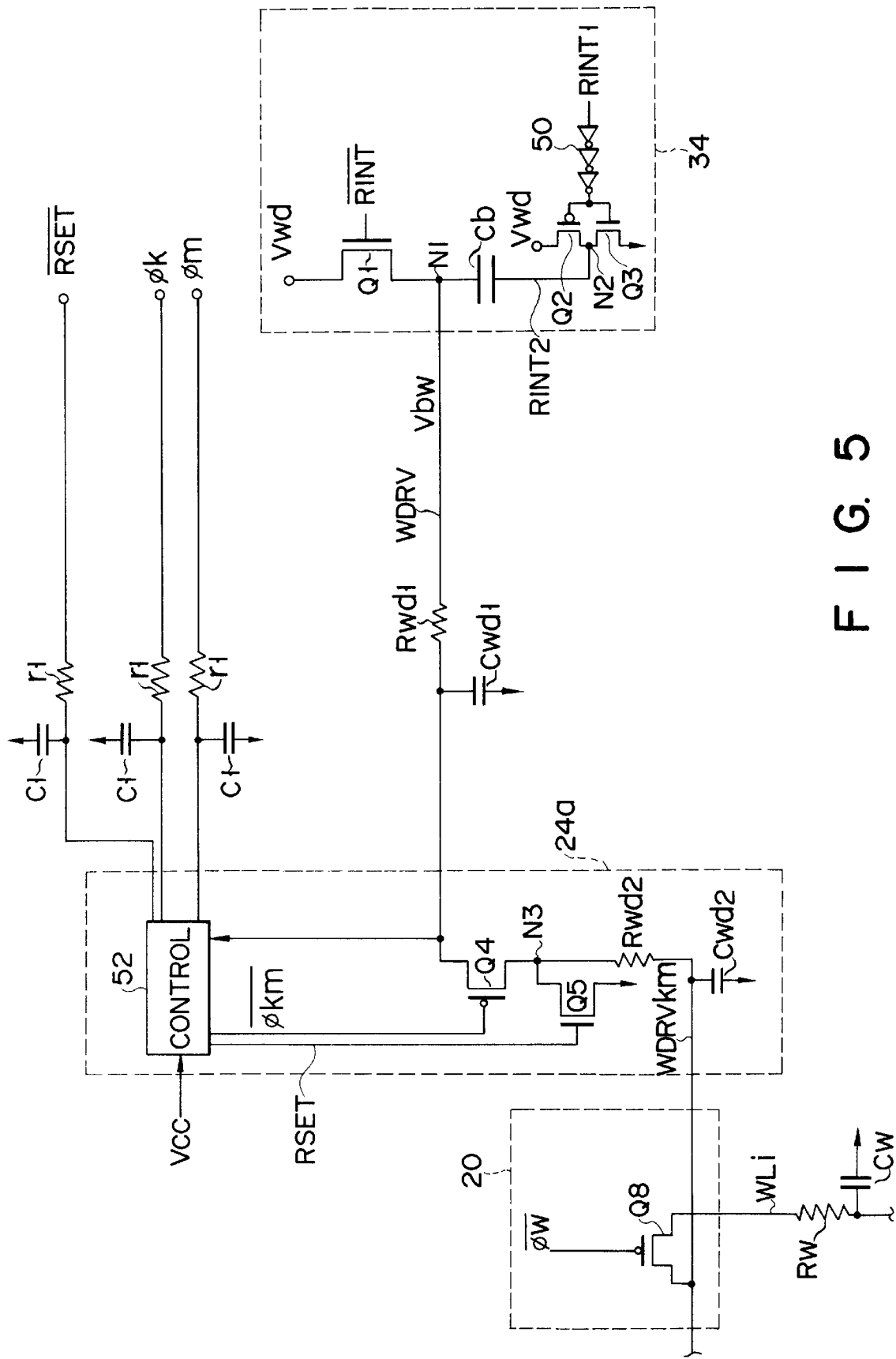
FIG. 5 is a diagram showing a modified circuit configuration of the main sections of the DRAM, including a word-line drive circuit, a row decoder, and a pre-decoder section of a core control circuit.

The circuit arrangement of FIG. 3 may be modified as shown in FIG. 5, wherein the row decoder 20 consists of a single MOS transistor Q8 of P-channel type. The gate electrode of transistor Q8 is directly applied with an inverted row address signal $\overline{\phi w}$. With such an arrangement, the aforementioned advantages can be obtained.

Turning now to FIG. 6, a word-line drive circuit arrangement is shown, which further improves the word-line driving speed by electrically disconnecting the first word-line drive line WDRV from the remaining circuit components: this may be done either when potentially activating the selected word line WLi toward the boosted voltage potential, or when deactivating the same toward the substrate voltage vss to make it nonselective.

As shown in FIG. 6, a pre-decoder circuit 60 provided in the core control circuit 24 essentially consists of six transistors including four transistors Q11, Q12, Q13, Q14 in addition to the MOS transistors Q4 and Q5 shown in FIG. 3. More specifically, P-channel MOS transistor Q4 is arranged between the first and second word-line drive lines WDRV and WDRVkm in the same manner as in the embodiment of FIG. 3. The discharging N-channel MOS transistor Q5 is connected between the second drive line WDRVkm and the ground potential. Additional four transistors Q11, Q12, Q13, Q14 constitutes a latch circuit 62. P-channel MOS transistors Q13 and Q14 have the gate electrodes and the drain electrodes which are cross-coupled to a circuit node N4 at which the gate electrodes of transistors Q4 and Q5 are connected together. Transistors Q13 and Q14 forms a flip-flop circuit. The drain electrode of transistor Q13 is ground via N-channel MOS transistor Q11, whereas the drain electrode of transistor Q14 is ground via N-channel MOS transistor Q12. The gate electrodes of transistors Q11 and Q12 are connected to an internal control circuit 64. Circuit 64 generates complementary control signals SET and $\overline{SET}$ in response to signals $\overline{RSET}$, $\phi k$, $\phi m$. Transistors Q11 and Q12 perform switching operations in response to the signals SET and $\overline{SET}$.

The associated pulsing sequence is shown in FIG. 7. When activating the selected word line WLi, transistor Q4 turns on, and transistor Q5 turns off. Under such a condition, the boosted voltage Vbw developed on the first word-line drive line WDRV is transferred via transistor Q4 to the second word-line drive line WDRVkm, and then applied to word line WLi. A voltage representing the information stored in a selected memory cell M is introduced onto a corresponding pair of bit lines BL and $\overline{BL}$ and sensed and read out by a sense amplifier associated therewith.

When $\overline{RAS}$ returns to the "H" level at a time t1, the control signals SET and $\overline{SET}$ are inverted. The voltages at nodes N4 and N5 of latch circuit 62 is inverted at a time t2, turning transistor Q4 off, and transistor Q5 on. Responding the turn-off of transistor Q4, the first word-line drive line WDRV is electrically separated from the second word-line drive line WDRVkm. Only drive line WDRVkm and word line WLi begin discharging via transistor Q5. This allows that while drive line WDRV of relatively large line-capacitance is kept at "H" level, word line WLi is made to fall potentially.

As shown in FIG. 6, the potential drop of the boosted voltage Vbw on the first word-line drive line WDRV is performed by changing control signal RINT of the word-line driver circuit 34 (see FIG. 2) from the "H" level to "L" level after the completion of the potential-rise driving of word line WLi. This potential drop-drive operation of drive line WDRV may be carried out during a bit-line equalization period, which is inherently necessary after the potential-drop of the word line. More specifically, enough time more than is needed has been allocated to execution of the potential-drop operation on word-line drive line WDRV; even if it takes longer time due to the resistance of line WDRV, such time consumption does not affect the total data-access speed of DRAM 10. Only the selected word line WLi is to be driven to drop rapidly.

With the above embodiment, due to the electrical separation of the first drive line WDRV, the substantial load that remains in the word-line drive line discharging via transistor Q5 is only the second drive line WDRVkm and its following wiring line. The first drive line WDRV is no longer included in the discharge load. The total discharge load can thus be decreased. Additionally, the turn-on resistance of discharging transistor Q5 can be reduced, since the gate electrode of this transistor is driven by boosted drive voltage Vbw. These factors enable the word-line drive operation to speed up.

The aforesaid embodiment arrangement will become more useful when it is applied to a specific case wherein a regulated d.c. voltage that is essentially independent of variation in the power supply voltage Vcc of DRAM 10 is employed as the source voltage of word-line driver circuit 34. With the use of such voltage Vwd for booster circuit 34, voltage Vwd can hold a fixed potential level even when the power supply voltage Vcc varies accidentally. Therefore, even if power supply voltage vcc falls at its minimum allowable level Vccmin, it is possible to supply a target word line WLi with a suitable drive voltage. This may increase the word-line driving speed.

Figure 8:
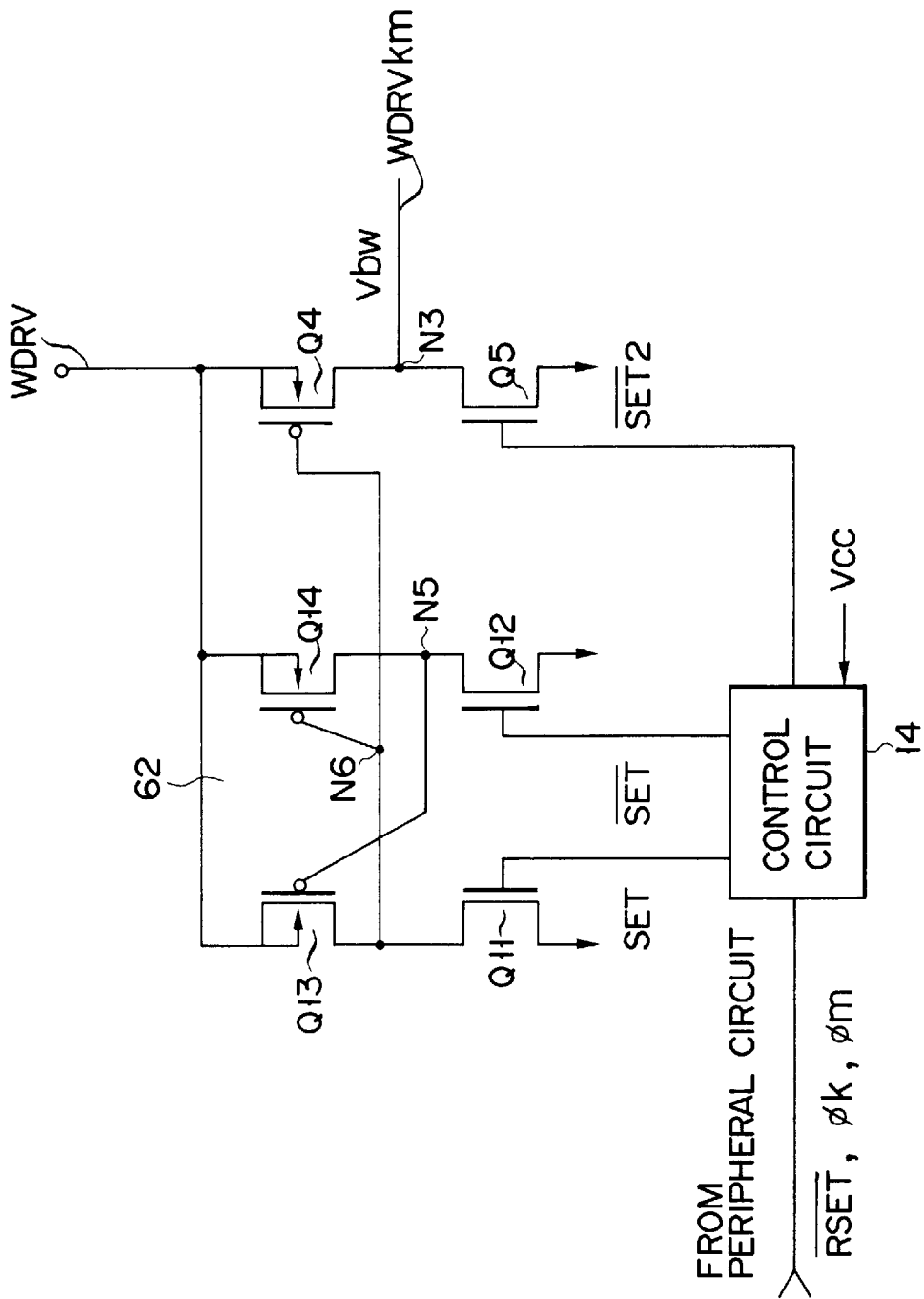
FIG. 8 is a diagram showing a modified arrangement of the circuit of FIG. 6.

The circuit arrangement may be modified as shown in FIG. 8, wherein the gate electrode of N-channel MOS transistor Q5 is independently connected to the control circuit 64, while the gate electrode of MOS transistor Q4 is connected to a circuit node N6 of latch circuit 62. Control circuit 64 provides transistor Q4 with a control signal $\overline{SET2}$, which has "H" level equal to the power supply voltage Vcc. Signal $\overline{SET2}$ is synchronous in its pulse timing with the control signal $\overline{SET}$. The circuit operates in the same manner as that of FIG. 6, except the fact that transistor Q5 performs a switching operation in response to signal $\overline{SET2}$. In this case, the turn-on resistance of transistor Q5 becomes higher than compared to the case of FIG. 6; however, a similar technical advantage regarding high-speed word-line drive operation may be accomplished.

The rest of this description will be devoted to present several circuit modifications that are recommendably employed as the voltage booster circuit 34 of FIG. 3 acting as the word-line driver circuit. Each of the circuits that follow will play an important role in order to take full advantage of the previously described high-speed word-line driving operation of the present invention. This can be said because any one of the following circuits can provide extra advantages of: (1) compensating for any undesirable potential drop due to a parasitic capacitance inherent in a selected word line, and (2) causing the word line voltage to constantly hold at a suitable potential that is less than the dielectric breakdown voltage of memory cells associated therewith.

A word-line driver circuit having a "dual capacitor" structure is shown in FIG. 9. The associated pulsing sequence is presented in FIG. 10. As shown in FIG. 9, the driver circuit includes two bootstrap capacitors Cb1 and Cb2 that are connected in parallel with each other. The first capacitor Cb1 is larger in capacitance than the second capacitor Cb2. Assuming that the total capacitance Cb (=Cb1 and Cb2) is sufficiently greater than the aforesaid capacitances Cwd1, Cwd2, Cw (see FIG. 3), the capacitance of capacitor Cb2 is specifically set as follows:

$$Cb2 \sim 2(Cw+Cwd2). \qquad (5)$$

The first electrodes of these capacitors Cb1 and Cb2 are connected together at a circuit node N7, which is connected to the first word-line drive line WDRV shown in FIG. 3, for example. Capacitors Cb1 and Cb2 are provided with a charge-up drive circuits, respectively. One of such circuit has a series circuit of two MOS transistors Q2 and Q3 that is connected to the remaining electrode of capacitor Cb1 in the same manner as in the embodiment of FIG. 3; the other circuit similarly has a series circuit of corresponding MOS transistors Q20 and Q21 of opposite channel types, which is connected to the remaining electrode of capacitor Cb2. MOS transistor Q20 is of P-channel type; transistor Q21 is of N-channel type.

The first bootstrap capacitor Cb1 is controlled by the corresponding drive circuit including transistors Q2 and Q3, in response to the control signal RINT1 that is synchronous with $\overline{RAS}$ signal that is generated prior to the determination of memory address. The charge-up at the second bootstrap capacitor Cb2 is as follows. The capacitor drive circuit including transistors Q20 and Q21 receives a valid address determination signal $\phi v1$ to generate a specific control signal $\phi v2$. The control electrode of capacitor Cb2 is applied with signal $\phi v2$, so that the capacitor Cb2 charges up in synchronous with the determination of memory address.

As can be seen from FIG. 10 the word line WLi is potentially activated depending on charging only at the first capacitor Cb1 before the address determination, i.e., before decoder transistor Q4 turns on. This operation is basically same as the corresponding part of the operation in the embodiment of FIG. 3.

At a time t1 a certain address is defined, and the transistor Q4 turns on causing electrical carrier to flow into word line WLi from word-line drive line WDRV. The second capacitor Cb2 is then driven to supplement a suitable amount of charge flow to word line WLi. By such carrier supply, the shortage of charge carrier, which corresponds to a decreased potential level indicated by a dashed line L1 in FIG. 10, may be fulfilled to obtain an ideal potential level defined by line L2. Therefore, when control signal $\overline{\phi km}$ falls at "L" level at time t2, the selected word line WLi is effectively ramped toward the boosted drive voltage Vbw. Since the capacitance Cb2 has been defined to satisfy the equation 5, the potential on word-line drive line WDRV can be stabilized at a fixed level before and after the turn-on/off switching operation of the decoder transistor Q4 included in pre-decoder 24a. It becomes possible to successfully compensate for potential drop of drive voltage Vbw due to carrier distribution on line WDRV by the address acquirement, thereby enforce or guarantee constancy in the potential of word-line drive voltage Vbw.

Another booster circuit arrangement is shown in FIG. 11. The associated pulsing sequence is shown in FIG. 12. This embodiment is similar to that of FIG. 9 with a P-channel MOS transistor Q22 being added between the node N7 and the second bootstrap capacitor Cb2. Transistor Q22 has a gate electrode to which a switching control signal $\overline{\phi c}$ is supplied. Transistor Q22 turns off, causing capacitor Cb2 to be disconnected from node N7 while the charge-up is being made at capacitor Cb1.

As is apparent from FIG. 12, the control signal $\overline{\phi c}$ is at the "L" level at potential-rise-starting time t1 of word line WLi. Transistor Q22 is made to turn on. The operation of applying boosted voltage Vbw using the dual capacitor structure to word line WLi is substantially the same as the aforesaid embodiments. When the word line falls potentially, control signal $\overline{\phi c}$ rise to "H" level at time t2. Transistor Q22 turns off. Capacitor Cb2 is thus electrically disconnected from drive line WDRV. Therefore, the terminal voltage of capacitor Cb2 can be substantially independent from unwanted potential drop L1 on line WDRV. This means that it becomes unnecessary to charge up capacitor Cb2 from the pre-charge potential to the boosted voltage Vbw in every active cycle. Wasteful (insignificant) discharge at capacitor Cb2 can be eliminated to save the power consumption of DRAM 10.

A still another booster circuit is shown in FIG. 13; the associated pulsing sequence is shown in FIG. 14. The circuit arrangement of FIG. 13 is similar to the circuit 34 of FIG. 3 in a single bootstrap capacitor Cb is employed. This circuit is featured in that the control terminal of capacitor Cb is driven with "two-phase" control scheme, as will be described below.

An N-channel MOS transistor Q23 is connected between the transistor Q2 and Q3. The and gate drain electrodes are connected together to a circuit node N8. Transistor Q23 acts as a level-shift device 72. A P-channel MOS transistor Q24 is provided to have a gate electrode to which the address determination signal $\phi v1$ is supplied, a source electrode connected to the voltage Vwd, and a drain electrode connected to node N8. The control terminal of capacitor Cb is also connected to node N8.

The potential-rising drive is as follows. In the time waveform of FIG. 14, when $\overline{RAS}$ changes at the "H" level, the control signal RINT1 is generated. P-channel transistor Q2 turns on, and N-channel transistor Q3 turns off. The control terminal voltage of capacitor Cb increases at time 2 up to a specific potential Vwd' that is lower than voltage Vwd by a preselected voltage Vsm. Voltage Vsm is determined by level-shifting transistor Q23. The voltage on word-line drive line WDRV rises in response to application of voltage Vwd' as shown by a line 74 in FIG. 14.

When a certain address is acquired at time t3, decoder transistor Q4 turns on, and the signal $\phi v1$ changes to the "L" level. Transistor Q24 thus turns on. Voltage Vwd is applied via transistor Q24 to the control terminal of capacitor Cb. The control terminal voltage RINT2 further rises toward voltage Vwd. With such "two-phase bootstrap capacitor control" technique, it is possible to prevent the word-line voltage from being decreased or dropped undesirably due to the same principle of the previously described embodiments of FIGS. 9 and 11 having the "dual capacitor" structure.

A still another arrangement preferably used for the booster circuit 34 is shown in FIG. 15, wherein a reference voltage generator circuit 80 is provided for receiving the power supply voltage Vcc and for generating a d.c. voltage of a fixed potential level. Two amplifier circuits 82 and 84 are connected to the output of circuit 80, for generating constant voltages Vwd1 and Vwd2 of different potential levels. Voltage Vwd1 is potentially greater in magnitude than voltage Cwd2 as shown in FIG. 16. P-channel MOS transistors Q30 and Q31 are connected to the outputs of amplifiers 82 and 84, respectively. Transistor Q30 has a gate electrode commonly connected with the gate electrode of transistor Q3 at which the signal $\phi v1$ is supplied. The other transistor Q31 has a gate electrode to which the signal RINT1 is applied. The drain electrodes of transistors Q30 and Q31 are connected together to the control terminal of bootstrap capacitor Cb. Transistor Q3 may serve as a common control transistor for the first series circuit section of amplifier 82 and transistor Q30, and for the second series circuit section of amplifier 84 and transistor Q31. The voltage Vwd1 output of amplifier 82 is tied directly to transistor Q1.

The circuit of FIG. 15 performs a word-line drive function in the "two-phase control" mode being similar to that of the FIG. 13 circuit which has been already explained with reference to FIG. 14. For this reason, the timing diagram of FIG. 16 has been simplified to show the main signals only; the remaining signals are same as those in FIG. 14. The circuit of FIG. 15 features in that the first and second voltages Vwd1 and Vwd2 are used which are potentially kept constant independently of any variation in the power supply voltage Vcc as shown in FIG. 16.

More specifically, when $\overline{RAS}$ changes at "L" level, RINT1 is at a "H" level in the same manner shown in FIG. 14. Transistor Q31 turns on, causing the first voltage Vwd2 to be supplied to the control terminal of capacitor Cb. Capacitor Cb charges up to a corresponding boosted voltage, which then appears on line WDRV. After the determination of address at time t3 (see FIG. 14), the signal $\phi v1$ falls at "L" level, causing transistor Q30 to turn on. The higher voltage Vwd1 is then permitted to be transferred to the control terminal of capacitor Cb. A similar "two-phase" bootstrap driving is now accomplished.

The present invention is not limited to the above-described specific embodiments and may be practiced or embodied in still other ways without departing from the spirit or essential character thereof.

For example, the aforementioned embodiments have been explained by assuming that they are applied to ordinary DRAMs wherein an address is fetched after $\overline{RAS}$ is acquired; the present invention may also be applied to a special type of DRAMs wherein an address is not defined before fetching of an address. In such an application, it is recommendable to cause the word-line drive voltage Vbw generated in a peripheral circuit section to be applied to the row decoder and the pre-decoder in the front stage thereof before a row address is actually input thereto. This may serve to prevent the word-line driving operation to be delayed due to the delay in voltage transmission on the word-line drive line that has become longer as the memory density increases.

What is claimed is:

1. An integrated memory device integrated on a substrate, comprising:
   an array of memory cells arranged in rows and columns;
   row lines associated with the rows of memory cells;
   column lines associated with the columns of memory cells;
   row decoder means placed adjacent said array of memory cells on said substrate and connected to said row lines, for selecting a row line from among said row lines based on an input address input to said row decoder means;
   column decoder means connected to said column lines, for designating one of said column lines;
   a row-line drive line connecting said row decoder means at a first peripheral circuit region of said substrate peripheral to said array of memory cells to a second peripheral circuit region of said substrate distant to said first peripheral circuit region and peripheral to said array of memory cells and exhibiting resistance and capacitance which cause a signal transmission delay for a signal transmitted between said row decoder means and said second peripheral circuit region;
   driver means connected to said row-line drive line at said second peripheral circuit region so that said row-line drive line is connected between said row decoder means and said driver means, for generating a specific potentially raised voltage to said row decoder means via said row-line drive line as a row-line drive voltage in response to a /RAS signal; and
   means for inputting said row address to said row decoder means;
   said driver means generating said specific potentially raised voltage in response to said /RAS signal a predetermined time before the row address is input to said row decoder so that the specific potentially raised voltage is present at said row decoder means upon inputting of said row address to said row decoder means and raising of potential of the selected word line corresponding to the input row address occurs upon inputting of the row address, thereby to compensate for the signal transmission delay, introduced by the resistance and capacitance of the row-line drive line, of said specific potentially raised voltage from said driver means to said row decoder means via said row-line drive line.

2. A system according to claim 1, wherein said row decoder means comprises;
   a row decoder circuit having outputs connected to said row lines, for selecting a row line from among said row lines; and
   a pre-decoder circuit arranged adjacent to said row decoder circuit and connected between said row decoder circuit and said row-line drive line, for transferring the row-line drive voltage on said row-line drive line to said row decoder circuit when said row decoder means selects a row line from among said row lines; and
   a voltage transmission line connected between said pre-decoder circuit and said row decoder circuit; and
   said driver means having an output connected directly to said row-line drive line so that said row-line drive line remains constantly at said row-line drive voltage.

3. A system according to claim 2, wherein said pre-decoder circuit includes:
   first switch means connected between said row-line drive line and said voltage transmission line, for selectively transferring the row-line drive voltage on said row-line drive line to said voltage transmission line.

4. A system according to claim 3, wherein said pre-decoder circuit includes:
   second switch means connected to said voltage transmission line, for selectively connecting said voltage transmission line to a ground potential thereby to accelerate discharge on said voltage transmission line.

5. A system according to claim 3, wherein said voltage-transmission line is smaller in length than said row-line drive line.

6. A system according to claim 3, wherein said driver means comprises;
   a first capacitive means connected to said row-line drive line for boosting the row-line drive voltage on said row-line drive line.

7. A system according to claim 6, wherein said driver means further comprises:
   charge control means connected to said first capacitive means, for selectively providing said first capacitive means with a constant voltage employed to pre-charge said first capacitive means.

8. A system according to claim 6, wherein said driver means further comprises:
   a second capacitive means connected in parallel with said first capacitive means to said row-line drive line for booting the specific Potentially raised voltage on said row-line drive line;
   the first and second capacitive means being different from each other in capacitance values.

9. A system according to claim 8, wherein said second capacitive means has a capacitance that is preselected to compensate for a potential drop on said row line selected by said row decoder means.

10. A system according to claim 7, wherein said driver means comprises:
   potential-level shifting means connected to said capacitive means, for providing said first capacitive means with a level-shifted voltage potentially lower in magnitude than said row-line drive voltage is applied to said first capacitive means.

11. A system according to claim 1, wherein said specific potentially raised voltage is generated in response to a row address strobe signal.

12. An integrated memory device according to claim 1, wherein said row decoder means includes a pre-decoder containing a P-channel MOS transistor having a source connected to said driver means via said row-line drive line.

13. An integrated memory device according to claim 12, wherein said driver means applies the potentially raised drive voltage to said source of said P-channel MOS transistor.

14. A dynamic random-access memory integrated on a semiconductor substrate, comprising
   a memory array of rows and columns of memory cells;
   word lines connected with the rows of memory cells;
   row decoder means connected to said word lines, said row decoder means comprising a main decoder circuit connected to said word lines, for designating a word line from among said word lines, and a pre-decoder circuit connected to said main decoder circuit for selectively applying a word-line drive voltage to said main decoder circuit;
   column decoder means connected to said bit lines, for designating one of said bit lines;
   word-line driver means provided at a first peripheral circuit region on said substrate peripheral to said memory array and associated with said row decoder means, for generating a specific boosted voltage as the word-line drive voltage in response to a /RAS signal;
   wire means for electrically connecting said word-line driver means at said first peripheral circuit region to said pre-decoder circuit of said row decoder means provided at a second peripheral circuit region on said substrate peripheral to said memory array and distant to said first peripheral circuit region, said wire means exhibiting resistance and capacitance which cause a signal transmission delay for a signal transmitted between said pre-decoder circuit and said driver means; and
   means for inputting a row address designating a word line to said row decoder means;
   said driver means generating said specific potentially raised voltage in response to said /RAS signal a predetermined time before the row address is input to said pre-decoder circuit so that the specific potentially raised voltage is present at said pre-decoder circuit upon inputting of said row address to said row decoder means, said pre-decoder circuit of said row decoder means transferring the specific potentially raised voltage on said wire means to said main decoder circuit when said main decoder circuit designates a word line from among said word lines, thereby to compensate for the signal transmission delay, introduced by the resistance and capacitance exhibited by said wire means, of said specific potentially raised voltage from said word line driver means to said row decoder means via said wire means.

15. A memory according to claim 14, wherein said pre-decoder circuit is located adjacent to said main decoder circuit on said substrate, and has an input connected to said wire means and an output connected to said main decoder circuit, and wherein said pre-decoder circuit includes a voltage-controlled transistor which turns on selectively to connect said wire means to said main decoder circuit.

16. A memory according to claim 15, wherein said word-line driver means comprises:
   a booster circuit including a booting capacitor that is directly connected at one of its electrodes to said wire means; and
   charge-up controller means connected to the other of said electrodes of said capacitor, for controlling charge of said capacitor.

17. A memory according to claim 16, wherein said substrate is substantially rectangular in its planar shape, and wherein said wire means extends longitudinally on said substrate.

18. An integrated semiconductor dynamic random-access memory integrated on a semiconductor substrate, comprising
   a plurality of memory cell blocks, each of said memory cell blocks comprising an array of rows and columns of memory cells;
   parallel control lines associated with the rows of memory cells in each of said memory cell blocks;
   parallel data transfer lines associated with the columns of memory cells in each memory cell block;
   address buffer means for temporarily storing designated row and columns addresses specifying a memory cell to be selected from among said memory cells;
   row decoder means connected to said control lines and said address buffer means, for selecting one of said control lines with which the selected memory cell is associated;
   column decoder means connected to said data transfer lines and said address buffer means associated with the selected memory cell, and for permitting data to be transferred to or from said selected memory cell;
   sense amplifier means connected to said data transfer lines and said column decoder means, for sensing and amplifying data stored in said selected memory cell developed on a designated data transfer line;
   a voltage transmission line connected to said row decoder means at a first peripheral circuit region of said substrate peripheral to said plurality of memory blocks and exhibiting resistance and capacitance which cause a signal transmission delay;
   activating-controller means provided at a second peripheral circuit region of said substrate peripheral to said plurality of memory blocks and distant to said first peripheral circuit region and connected to said row decoder means by said voltage transmission line, for generating a potentially raised drive voltage in response to a /RAS signal;
   means for inputting a row address designating a control line to said row decoder means; and
   said activating-controller means generating said specific potentially raised voltage in response to said /RAS signal a predetermined time before the row address is input to said row decoder means so that the specific potentially raised voltage is present at said row decoder means upon inputting of said row address signal to said row decoder means, thereby to compensate for the signal transmission delay, introduced by the resistance and capacitance exhibited by said voltage transmission line, of said specific potentially raised voltage from said activating-controller means to said row decoder means via said voltage transmission line, said row decoder means transmitting, when it selects one of said control lines, the potentially raised drive voltage to said selected one of said control lines.

19. A memory according to claim 18, wherein said activation-controller means is arranged in a marginal surface area of said substrate that is common to said memory cell blocks, and is functionally shared by said memory cell blocks.

20. A memory according to claim 18, wherein said activation-controller means comprises:

a voltage-booting circuit including a bootstrap capacitor means directly connected to said voltage transmission line for booting a voltage on said voltage transmission line.

21. A memory according to claim 20, wherein said voltage-booting circuit includes:

charge-up driver means connected to said capacitor means, for controlling charging and discharging of said capacitor means.

22. A memory according to claim 21, wherein said voltage-booting circuit includes:

capacitor charging means for receiving a power supply voltage of said memory, using the received power supply voltage to generate a constant d.c. voltage and precharging said capacitor with said constant d.c. voltage.

23. An integrated memory integrated on a semiconductor substrate comprising:

at least one memory cell block fabricated on said semiconductor substrate and having a number of subareas each containing a number of memory cells;

a row decoder and a core control circuit which are associated with each of said subareas;

a voltage-booster circuit provided at a first peripheral circuit region of said substrate peripheral to said at least one memory block for generating a specific potentially raised voltage; and a wire line connecting said core control circuit, provided at a second peripheral circuit region of said substrate peripheral to said at least one memory block and distant to said first peripheral circuit region, to said voltage-booster circuit;

said voltage-booster circuit generating said specific potentially raised voltage in response to a /RAS signal a predetermined time before a row address is input to said row decoder so that the specific potentially raised voltage is present at said row decoder upon inputting of said row address to said row decoder and raising of potential of the selected word line corresponding to the input row address occurs upon inputting of the row address, thereby to compensate for the signal transmission delay, introduced by the wiring load of the row-line drive line, of said specific potentially raised voltage from said voltage-booster circuit to said row decoder means via said row-line drive line.

* * * * *